United States Patent [19]

Lu et al.

[11] Patent Number: 5,656,985
[45] Date of Patent: Aug. 12, 1997

[54] ELECTRONIC SURFACE MOUNT PACKAGE

[75] Inventors: Peter Lu, Flowermound, Tex.; Jeffrey Heaton, Cupertino; James W. Heaton, Los Altos, both of Calif.; Peter Loh Hong Pao, Hong Kong, China; Robert Lake Hang Lam, Hong Kong, China; Tsang Kei Sun, Hong Kong, Hong Kong

[73] Assignee: Halo Electronics, Inc., Redwood City, Calif.

[21] Appl. No.: 513,573

[22] Filed: Aug. 10, 1995

[51] Int. Cl.⁶ .................. H01F 15/10; H01F 27/02
[52] U.S. Cl. .................. 336/96; 174/52.4; 336/65; 336/192; 336/229; 361/821
[58] Field of Search .................. 174/52.4; 361/821; 336/229, 192, 65, 90, 96

[56]  References Cited

U.S. PATENT DOCUMENTS

| | | | |
|---|---|---|---|
| 4,205,291 | 5/1980 | Flemtee | 336/192 |
| 5,034,854 | 7/1991 | Sumun et al. | 336/192 |
| 5,307,041 | 4/1994 | Kato et al. | 336/192 |

FOREIGN PATENT DOCUMENTS

| | | | |
|---|---|---|---|
| 38-20060 | 9/1963 | Japan | 336/229 |
| 5-275253 | 10/1993 | Japan | 336/229 |

*Primary Examiner*—Thomas J. Kozma
*Attorney, Agent, or Firm*—Trial & Technology Law Group

[57] ABSTRACT

An electronic surface mount package provides a one piece construction package (with an open bottom) with one or more terminal pins molded into the package. Each of the pins have a notched post upon which a wire is wound which is from a toroid transformer carried within the package. Each of the posts are notched so their respective wires are separate from one another so as to prevent arcing. The case is opened at the bottom which prevents harm from expansion or cracking.

8 Claims, 5 Drawing Sheets

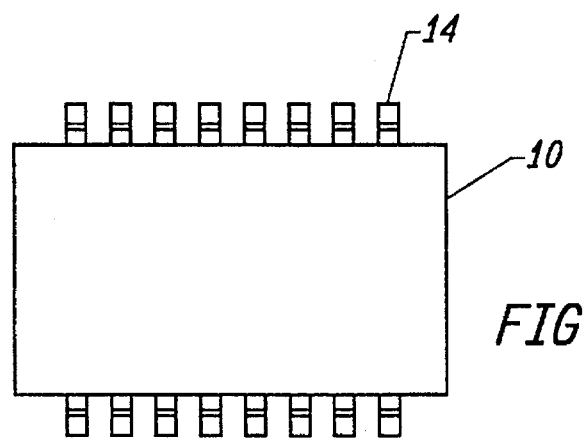
FIG. 9B
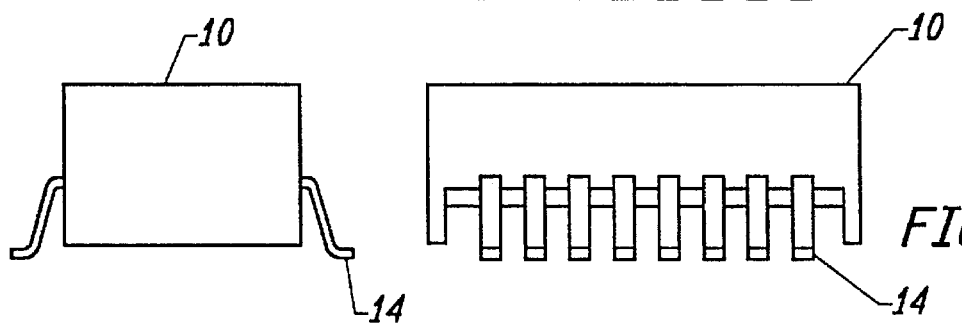
FIG. 9C
FIG. 9A
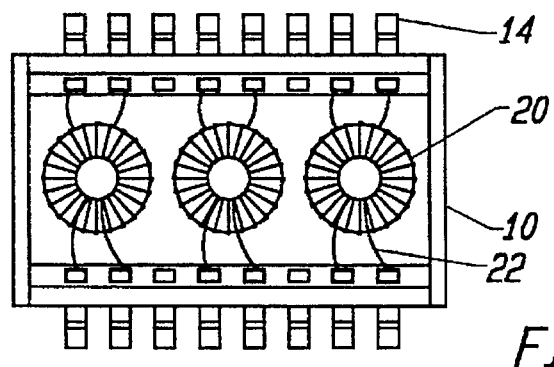
FIG. 9D

ELECTRONIC SURFACE MOUNT PACKAGE

BACKGROUND OF THE INVENTION

The present invention relates to an electronic surface mount package or case. Electronic surface mount packages are utilized in applications in which one or more individual toroid transformers are embodied within the surface mount package.

Wires coming off the transformers are electronically tied to pins on the package for connection to an electronic device. Typically, the electronic surface mount packages are mounted on a printed circuit board for utilization in the electronic device.

SUMMARY OF THE INVENTION

It is an object of the present invention to provide an improved electronic surface mount package.

Briefly, according to one preferred embodiment, the present invention provides a one piece construction package (with an open bottom) with one or more terminal pins molded into the package. Each of the pins have a notched post upon which a wire is wound which is from a toroid transformer carried within the package. Each of the posts are notched so that the respective wires are separated from one another so as to avoid arcing. The case is open at the bottom which prevents harm from expansion or cracking.

Other objects, features, and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 9A–9D show end, top, side, and bottom views of electronic surface mount package according to the present invention.

DETAILED DESCRIPTION OF THE DRAWINGS

Reference will now be made in detail to the preferred embodiments of the invention, examples of which are illustrated in the accompanying drawings, where like numerals indicate like components. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
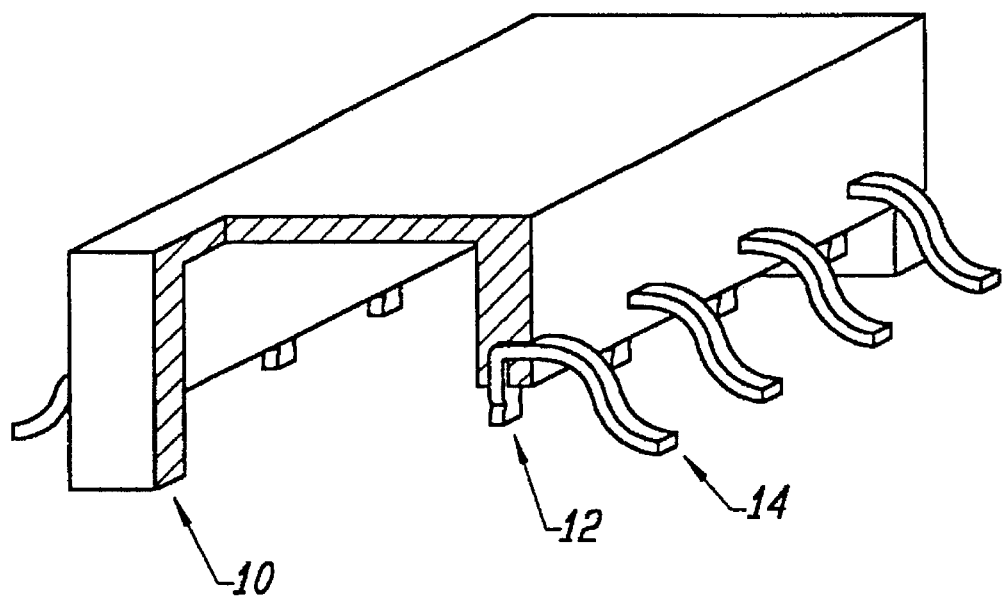
FIG. 1 shows an electronic surface mount package in three-dimensional view according to the present invention.

FIG. 1 shows an electronic surface mount transformer package or case 10 in three-dimensional view. FIG. 1 shows a cut-away of the generally rectangular empty case 10 with pins 14 molded into the case 10, together with notched post 12 upon which a wire is wound. Typically, tin-Lead plated copper alloy terminals are molded into the wall of the package 10 with the terminals extending through and below the bottom of the wall. The outer portion of the package 10 is formed to meet specified footing requirements. The inner post 12 serves as a terminal for internal wire termination use. The package material is made of a type of thermal plastic which is in compliance with UL V-94 requirement for flammability.

Figure 2:
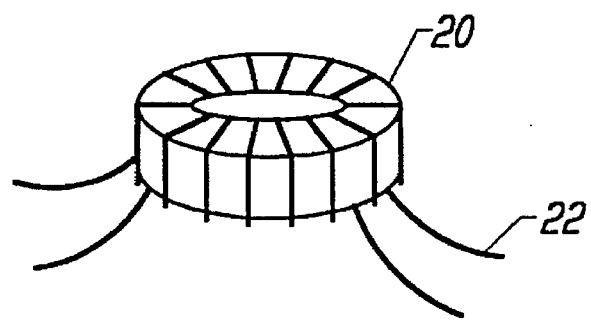
FIG. 2 shows a wound toroid transformer.

FIG. 2 shows a wound toroid transformer 20 with wire 22 wrapped around the transformer 20. The toroid core is typically made of ferrite or iron material and the winding of wire 22 is done manually with fine insulated magnet wire.

Figure 3:
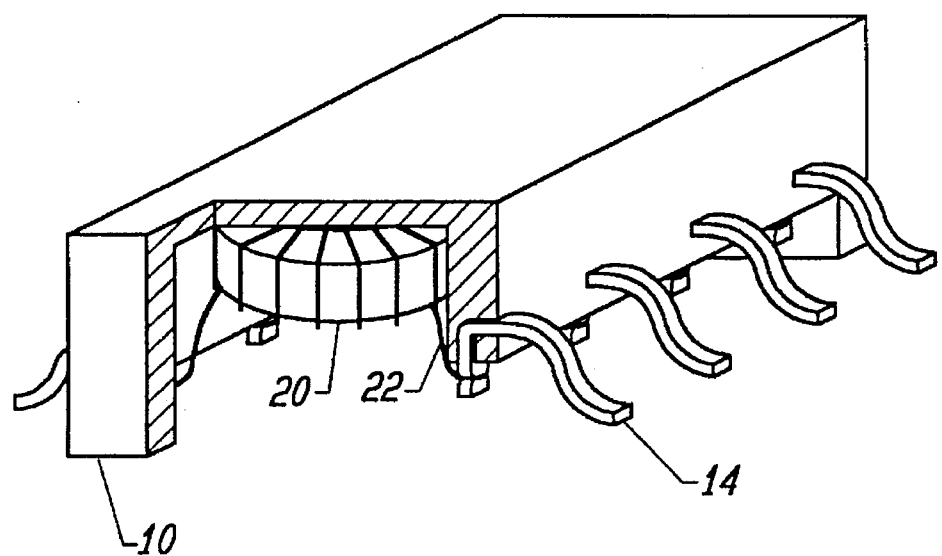
FIG. 3 shows the connection of the toroid transformer of FIG. 2 within the electronic surface mount package of FIG. 1.

FIG. 3 shows a cut-away of the molded part with the toroid 20 mounted inside and showing the wire 22 as it is then attached to post 14. The wires 22 are pulled with minimum tension and wrapped around the terminal post 14 for two to two and a half turns. This operation is done when the case has been placed bottom side up.

Figure 4:
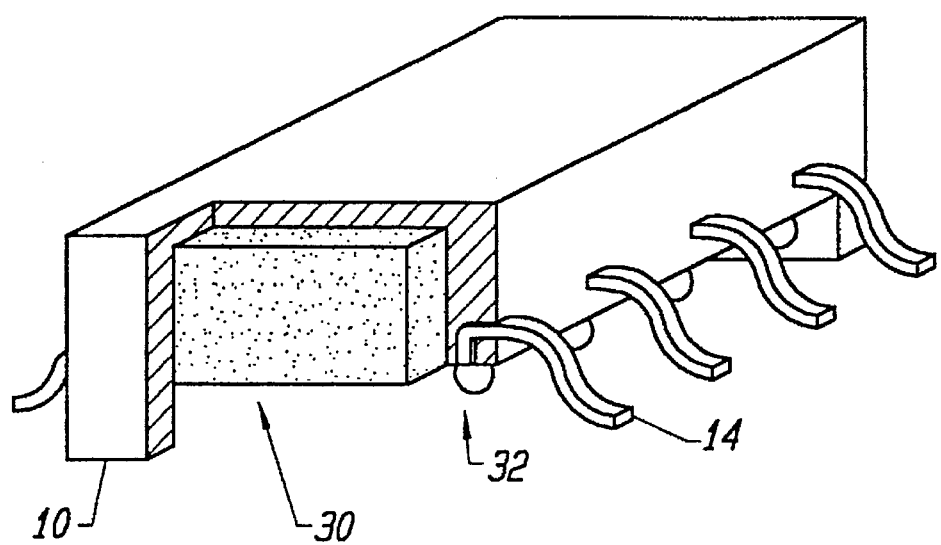
FIG. 4 within the electronic surface mount package of FIG. 1 after terminations have been soldered.

FIG. 4 shows a silicone compound 30 poured inside the cavity with wire terminations that have been soldered with high temperature solder (95 Ag/5Sn) 32 and the package has been properly cleaned. The case 10 is then filled with soft silicone material to protect the transformer and to meet environmental requirements.

Figure 5:
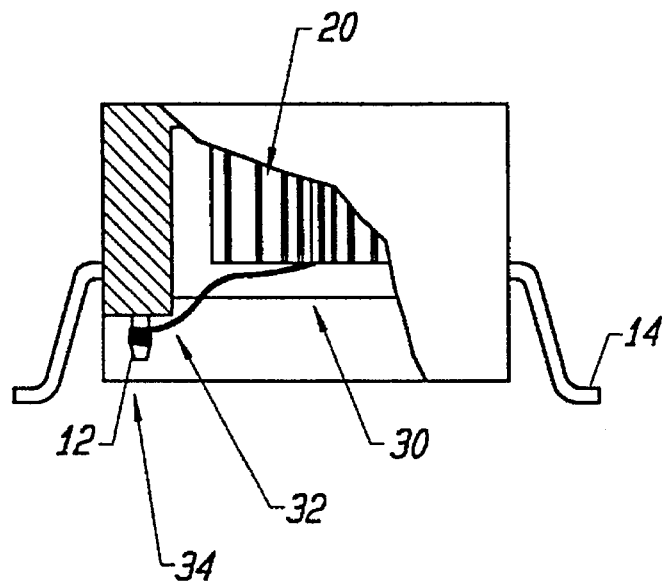
FIG. 5 and 6 show relationship between a safeguard (standoff) and the electronic surface-mount package's foot seating plane and inner terminal posts, respectively.
Figure 6:
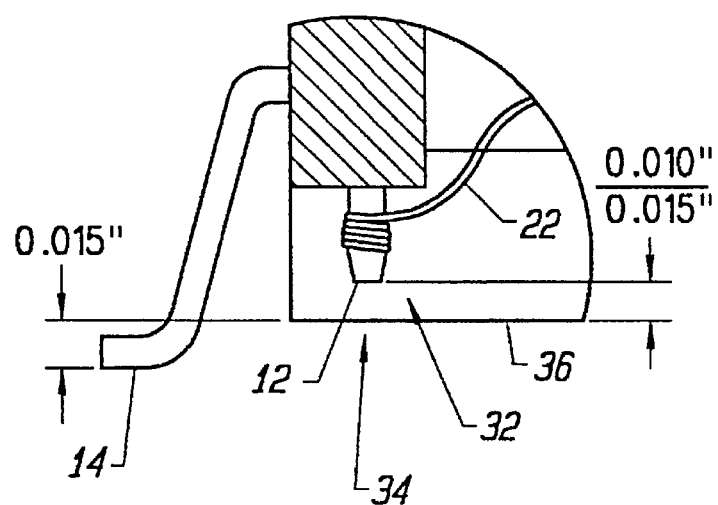

FIGS. 5 and 6 show the relationships between the safe guard (stand off) 34 and package's foot seating plane and inner terminal posts 12a. FIG. 5 shows the standoff 34, in which the parts typically are placed automatically by machine onto a PC board. They are pressed down, as it is desirable to have some limitation of how far they can be pressed. It is also desirable that the post 12 does not touch the PC board, and so the end standoffs 34 do not allow that to happen.

FIG. 6 shows the distance in relationship between the end of the post 12 and where the PC board 36 is located and also where the standoff 34 ends. The PC board 36 would be at the base of the foot.

In FIG. 6, the typical clearance of 0.015 inches from the safe guard 34 to the seating plane is to avoid interference to the coplanarity of the package. There is also a gap between the safe guard 34 and terminal post 12 to prevent the solder joints from touching the circuit board due to an over forced pick and place operation.

Inside the package 10, there may be two, three, or more individual toroidal transformers. Wires coming off of the transformers are connected to the outside world. For example, the pins may be mounted on a printed circuit board in an electronic device. The lead frame pins are injection molded and the shape of the post upon which the wire is wound from the toroidal transformer is notched. This allows for the wires to be separated from pin to pin, and for soldering to be much more efficient.

Figure 7:
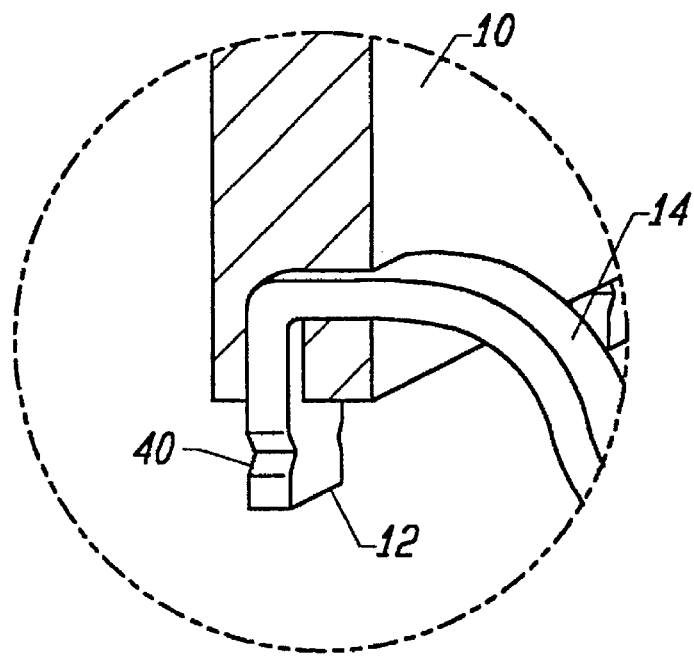
FIG. 7 shows a close-up of the pin configuration of FIG. 1 and how it is molded inside the wall of the body of the package.

FIG. 7 shows a closeup of the pin 12 and how pin 12 is molded inside the wall of the body and also the notch effect 40 of the pin 12. The post 14 is notched so that the wires are kept away from one another (post to post) which is very desirable. The separation is desirable so as to avoid arcing.

Figure 8:
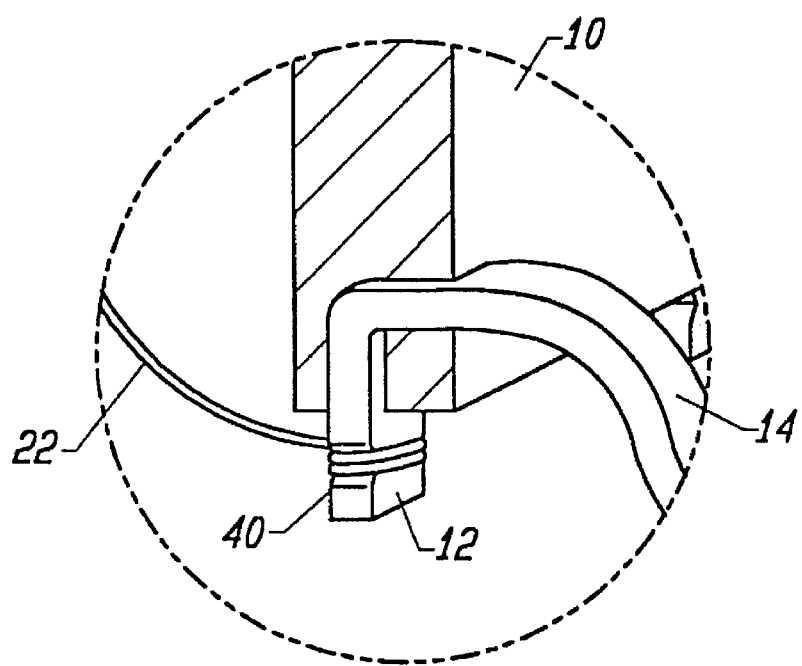
FIG. 8 shows wire wrapped around the pin or post of FIG. 7.

FIG. 8 shows the wire 22 wrapped around the pin or post 12.

FIGS. 9A–9D show end, top, side, and bottom views, respectively, of the electronic surface mount package 10. The embodiment shown in FIGS. 9A–9D provide an industrial standard surface mount footprint and package dimensions which are auto pick and placeable. In addition, special design consideration has been applied to thermal expansion of materials to ensure that the package will stand all normal reflow processes with low cost, easy manufacturing, and high reliability.

In the industry, many manufacturers have used a two-piece construction, a base and a cover, and the case is backfilled with epoxy. In some processes, the coefficients of expansion of the epoxy that has been backfilled, plus the toroid itself, tend to cause the two pieces to separate. The base separates from the top, and as a result, it can end up cracking. The present invention provides a one-piece construction (an open bottom) only with the silicone filling to protect the toroid. The case is open at the bottom, thus allowing for nothing to expand or crack.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. An electronic surface mount package comprising:
    a one piece construction package having a side wall and an open bottom,
    a plurality of toroid transformers carried within said package by a soft silicone material, said toroid transformers each having wires wrapped thereon,
    a plurality of terminal pins molded within and extending from the bottom of said package, each of the said pins extending through a bottom of said side wall and having a notched post upon which said wires from said transformers are wrapped and soldered thereon, respectively.

2. An electronic surface mount package comprising:
    a construction package having a side wall and an open bottom,
    a plurality of toroid transformers carried within said package by a soft silicone material, said toroid transformers each having wires wrapped thereon,
    a plurality of terminal pins molded within and extending from the bottom of said package, each of said pins extending through a bottom of said side wall and having a notched post upon which said wires from said transformers are wrapped and soldered thereon, respectively.

3. A package as in claim 2 wherein said construction package is one piece.

4. The package of claim 3 wherein said construction package has an open bottom.

5. The package of claim 4 wherein said posts are separated from one another so as to avoid arcing.

6. An electronic surface mount package for mounting on a printed circuit board in an electronic device, said electronic surface mount package comprising:
    a one piece construction package having a side wall and an open bottom,
    a plurality of toroid transformers carried within said package by a soft silicone material, said toroid transformers each having wires wrapped thereon,
    a plurality of terminal pins molded within and extending from the bottom of said package, each of said pins extending through a bottom of said side wall and having a notched post upon which said wires from said transformers are wrapped and soldered thereon, respectively.

7. The package as in claim 6 further including a standoff for maintaining a distance between the bottom of said pins and said printed circuit board.

8. An electronic surface mount package comprising:
    a construction package having a side wall and an open bottom,
    at least one toroid transformer carried within said package by a soft silicone material, said toroid transformer having a wire wrapped thereon,
    at least one terminal pin molded within and extending from the bottom of said package, said pin extending through a bottom of said side wall and having a notched post upon which said wire from said transformer is wrapped and soldered thereon.

\* \* \* \* \*

UNITED STATES PATENT AND TRADEMARK OFFICE
CERTIFICATE OF CORRECTION

PATENT NO : 5,656,985
DATED : August 12, 1997
INVENTOR(S): Lu et al.

It is certified that error appears in the above-identified patent and that said Letters Patent is hereby corrected as shown below:

On the title page item [75] Inventors,

Please delete "Peter Loh Hong Pao" and replace with -- Peter Loh Hang Pao --.

Please delete "Robert Lake Hang Lam" and replace with -- Robert Loke Hang Lam --.

Signed and Sealed this

Twenty-third Day of December, 1997

Attest:

BRUCE LEHMAN

Attesting Officer

Commissioner of Patents and Trademarks

US005656985C1

(12) EX PARTE REEXAMINATION CERTIFICATE (7288th)
United States Patent
Lu et al.

(10) Number: US 5,656,985 C1
(45) Certificate Issued: Jan. 5, 2010

(54) ELECTRONIC SURFACE MOUNT PACKAGE

(75) Inventors: Peter Lu, Flowermound, TX (US);
Jeffrey Heaton, Cupertino, CA (US);
James W. Heaton, Los Altos, CA (US);
Peter Loh Hang Pao, Hong Kong (CN);
Robert Loke Hang Lam, Hong Kong (CN); Tsang Kei Sun, Hong Kong (HK)

(73) Assignee: Halo Electronics, Inc., Redwood City, CA (US)

Reexamination Request:
No. 90/009,140, May 5, 2008

Reexamination Certificate for:
Patent No.: 5,656,985
Issued: Aug. 12, 1997
Appl. No.: 08/513,573
Filed: Aug. 10, 1995

Certificate of Correction issued Dec. 23, 1997.

(51) Int. Cl.
*H01F 15/10* (2006.01)
*H01F 27/02* (2006.01)

(52) U.S. Cl. .............................. 336/96; 336/192; 336/65; 336/229; 174/52.4; 361/821

(58) Field of Classification Search ........................ None
See application file for complete search history.

(56) References Cited

U.S. PATENT DOCUMENTS

| 3,353,124 | A |   | 11/1967 | Dilger |
|---|---|---|---|---|
| 3,721,747 | A | * | 3/1973 | Renskers ................. 174/532 |
| 4,789,847 | A |   | 12/1988 | Sakamoto et al. |
| 4,930,200 | A |   | 6/1990 | Brush, Jr. et al. |
| 5,069,641 | A |   | 12/1991 | Sakamoto et al. |
| 5,212,345 | A | * | 5/1993 | Gutierrez ................. 174/556 |
| 5,277,625 | A |   | 1/1994 | Iannella et al. |
| 5,309,130 | A |   | 5/1994 | Lint |
| 5,321,372 | A |   | 6/1994 | Smith |
| 5,337,028 | A |   | 8/1994 | White |
| 5,587,884 | A |   | 12/1996 | Raman |
| 5,805,431 | A |   | 9/1998 | Joshi et al. |
| 6,116,963 | A |   | 9/2000 | Shutter |
| 6,769,936 | B2 |  | 8/2004 | Gutierrez et al. |

FOREIGN PATENT DOCUMENTS

JP          07-161535        *   6/1995

OTHER PUBLICATIONS

"Mounting & Packing Techniques For Toroidal Devices," authored by Harold Tischler, and published in the Oct. 1993, Proceedings of Electrical Electronics Insulation Conference and Electrical Manufacturing & Coil Winding Conference.*
NPI 10BaseT Catalog Page, 1992.*
NPI Isolation Transformers Catalog Page, Oct. 1991.*
Gongin H–16S, May 1987.*
"Surface Mount Transformers: A New Packaging Approach," authored by Brad J. McCormick et al., and published in the Feb. 1993 issue of Surface Mount Technology.*
Gongin RH–16, May 1987.*
Defendant Technitrol, Inc.'s First Supplemental Answers to Plaintiff Halo Electronics, Inc.'s First Set of Interrogatories, dated Jul. 4, 2009 (6 pages).
Defendant Pulse Engineering, Inc.'s First Supplemental Answers to Plaintiff Halo Electronics, Inc.'s First Set of Interrogatories, dated Jul. 4, 2009 (5 pages).

(Continued)

*Primary Examiner*—Tuan H Nguyen

(57) ABSTRACT

An electronic surface mount package provides a one piece construction package (with an open bottom) with one or more terminal pins molded into the package. Each of the pins have a notched post upon which a wire is wound which is from a toroid transformer carried within the package. Each of the posts are notched so their respective wires are separate from one another so as to prevent arcing. The case is opened at the bottom which prevents harm from expansion or cracking.

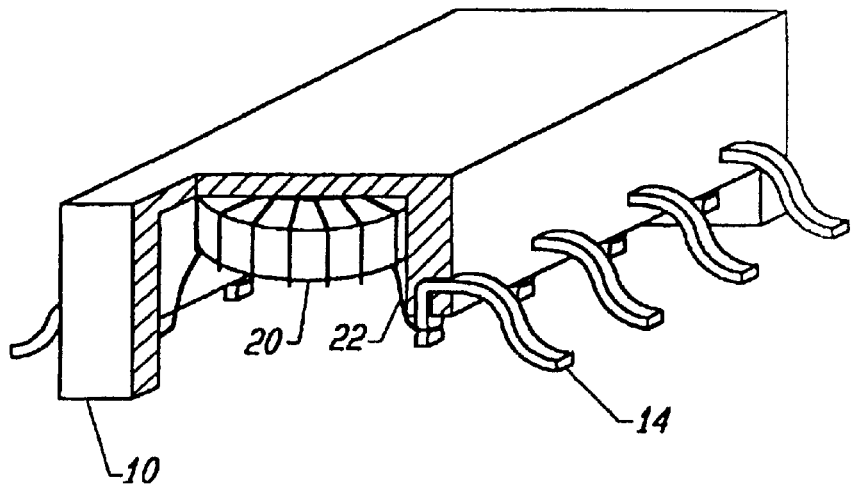

OTHER PUBLICATIONS

Plaintiff Halo Electronics, Inc.'s Responses to Defendant Pulse Engineering, Inc. and Defendant Technitrol, Inc.'s First Set of Interrogatories—Exhibit 11A—Preliminary Claim Chart for USPN 5,656,985, dated Jul. 13, 2009 (6 pages).

Plaintiff Halo Electronics, Inc.'s Responses to Defendant Pulse Engineering, Inc. and Defendant Technitrol, Inc.'s First Set of Interrogatories—Exhibit 11B—Preliminary Claim Chart for USPN 6,297,720, dated Jul. 13, 2009 (7 pages).

Plaintiff Halo Electronics, Inc.'s Responses to Defendant Pulse Engineering, Inc. and Defendant Technitrol, Inc.'s First Set of Interrogatories—Exhibit 11C—Preliminary Claim Chart for USPN 6,297,721, dated Jul. 13, 2009 (6 pages).

Plaintiff Halo Electronics, Inc.'s Responses to Defendant Pulse Engineering, Inc. and Defendant Technitrol, Inc.'s First Set of Interrogatories—Exhibit—Preliminary Claim Chart for USPN 6,320,489, dated Jul. 13, 2009 (9 pages).

Plaintiff Halo Electronics, Inc.'s Responses to Defendant Pulse Engineering, Inc. and Defendant Technitrol, Inc.'s First Set of Interrogatories—Exhibit 11E—Preliminary Claim Chart for USPN 6,344,785, dated Jul. 13, 2009 (11 pages).

Plaintiff Halo Electronics, Inc.'s Responses to Defendant Pulse Engineering, Inc. and Defendant Technitrol, Inc.'s First Set of Interrogatories—Exhibit 11F—Preliminary Claim Chart for USPN 6,662,431, dated Jul. 13, 2009 (3 pages).

* cited by examiner

US 5,656,985 C1

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–8 is confirmed.

New claims 9–22 are added and determined to be patentable.

9. *An electronic surface mount package comprising:*
*a construction package having a first side wall and an open bottom,*
*a plurality of toroid transformers carried within said package by a soft silicone material, said toroid transformers each having wires wrapped thereon,*
*a plurality of terminal pins molded within and extending from the bottom of said package, each of the said pins extending through a bottom of said first side wall and having a notched post upon which said wires from said transformers are wrapped and soldered thereon, respectively, wherein each of said posts is substantially parallel to said first side wall, and a portion of each of said terminal pins extends from and is substantially perpendicular to said first side wall, each of said terminal pins further including a lead for mounting onto the surface of the printed circuit board,*
*an end wall substantially perpendicular to said first side wall, wherein at least a portion of said end wall extends below said posts, and*
*a second side wall substantially parallel to said first side wall, and wherein said wires from said transformers are contained between first and second planes defined, respectively, by an outside surface of said first side wall and an outside surface of said second side wall.*

10. *The package of claim 9, wherein said portion of said end wall that extends below said posts includes a central section of a lower surface of said end wall.*

11. *The package of claim 9, wherein each of said terminal pins has a nonlinear portion disposed within said first side wall, and said nonlinear portion includes a first segment and a second segment substantially perpendicular to said first segment.*

12. *The package of claim 9, wherein the construction package is a one piece construction package.*

13. *An electronic surface mount package comprising:*
*a construction package having a first side wall and an open bottom,*
*a plurality of toroid transformers carried within said package by a soft silicone material, said toroid transformers each having wires wrapped thereon,*
*a plurality of terminal pins molded within and extending from the bottom of said package, each of said pins extending through a bottom of said first side wall and having a notched post upon which said wires from said transformers are wrapped and soldered thereon, respectively, wherein each of said posts is substantially parallel to said first side wall, and a portion of each of said terminal pins extends from and is substantially perpendicular to said first side wall, each of said terminal pins further including a lead for mounting onto the surface of the printed circuit board, and*
*a second side wall substantially parallel to said first side wall, and wherein said wires from said transformers are contained between first and second planes defined, respectively, by an outside surface of said first side wall and an outside surface of said second side wall.*

14. *The package of claim 13, wherein each of said terminal pins has a nonlinear portion disposed within said first side wall, and said nonlinear portion includes a first segment and a second segment substantially perpendicular to said first segment.*

15. *The package of claim 13, wherein the construction package is a one piece construction package.*

16. *An electronic surface mount package comprising:*
*a construction package having a first side wall and an open bottom,*
*at least one toroid transformer carried within said package by a soft silicone material, said toroid transformer having a wire wrapped thereon,*
*at least one terminal pin molded within and extending from the bottom of said package, said pin extending through a bottom of said first side wall and having a notched post upon which said wire from said transformer is wrapped and soldered thereon, wherein said post is substantially parallel to said first side wall, and a portion of said terminal pin extends from and is substantially perpendicular to said first side wall, said terminal pin further including a lead for mounting onto the surface of the printed circuit board,*
*an end wall substantially perpendicular to said first side wall, wherein at least a portion of said end wall extends below said post, and*
*a second side wall substantially parallel to said first side wall, and wherein said wire from said transformer is contained between first and second planes defined, respectively, by an outside surface of said first side wall and an outside surface of said second side wall.*

17. *The package of claim 16, wherein said portion of said end wall that extends below said post includes a central section of a lower surface of said end wall.*

18. *The package of claim 16, wherein said terminal pin has a nonlinear portion disposed within said first side wall, and said nonlinear portion includes a first segment and a second segment substantially perpendicular to said first segment.*

19. *The package of claim 16, wherein the costruction package is a one piece construction package.*

20. *An electronic surface mount package comprising:*
*a construction package having a first side wall and an open bottom,*
*at least one toroid transformer carried within said package by a soft silicone material, said toroid transformer having a wire wrapped thereon,*
*at least one terminal pin molded within and extending from the bottom of said package, said pin extending through a bottom of said first wall and having a notched post upon which said wire from said transformer is wrapped and soldered thereon, wherein said post is substantially parallel to said first side wall, and a portion of said terminal pin extends from and is substan-* tially perpendicular to said first side wall, said terminal pin further including a lead for mounting onto the surface of the printed circuit board, and a second side wall substantially parallel to said first side wall, and wherein said wire from said transformer is contained between first and second planes defined, respectively, by an outside surface of said first side wall and an outside surface of said second side wall.

21. The package of claim 20, wherein said terminal pin has a nonlinear portion disposed within said first side wall, and said nonlinear portion includes a first segment and a second segment substantially perpendicular to said first segment.

22. The package of claim 20, wherein the construction package is a one piece construction package.

* * * * *